US010741760B2

(12) United States Patent
Park et al.

(10) Patent No.: US 10,741,760 B2
(45) Date of Patent: Aug. 11, 2020

(54) RESISTIVE RANDOM ACCESS MEMORY DEVICE FOR 3D STACK AND MEMORY ARRAY USING THE SAME AND FABRICATION METHOD THEREOF

(71) Applicant: Seoul National University R&DB FOUNDATION, Seoul (KR)

(72) Inventors: Byung-Gook Park, Seoul (KR); Sungjun Kim, Seoul (KR); Min-Hwi Kim, Seoul (KR); Tae-Hyeon Kim, Jeonju-si (KR); Sang-Ho Lee, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 0 days.

(21) Appl. No.: 16/174,493

(22) Filed: Oct. 30, 2018

(65) Prior Publication Data
US 2019/0131523 A1  May 2, 2019

(30) Foreign Application Priority Data
Oct. 30, 2017 (KR) .................. 10-2017-0142238

(51) Int. Cl.
*H01L 45/00* (2006.01)
*H01L 27/24* (2006.01)

(52) U.S. Cl.
CPC ........ *H01L 45/1273* (2013.01); *H01L 27/249* (2013.01); *H01L 45/04* (2013.01); *H01L 45/122* (2013.01); *H01L 45/1226* (2013.01); *H01L 45/145* (2013.01); *H01L 45/146* (2013.01); *H01L 45/16* (2013.01); *H01L 45/08* (2013.01)

(58) Field of Classification Search
CPC ... H01L 45/1273; H01L 45/04; H01L 45/122; H01L 45/1226; H01L 45/145; H01L 45/146; H01L 45/16; H01L 45/08; H01L 27/249
See application file for complete search history.

(56) References Cited

U.S. PATENT DOCUMENTS

2014/0353567 A1* 12/2014 Wang .................. H01L 45/1233
257/2
2016/0149125 A1* 5/2016 Oh .......................... H01L 45/06
257/4

FOREIGN PATENT DOCUMENTS

KR        10-1257365      4/2013

* cited by examiner

*Primary Examiner* — Timor Karimy
(74) *Attorney, Agent, or Firm* — Gerald E. Hespos; Michael J. Porco; Matthew T. Hespos

(57) ABSTRACT

The present invention relates to a resistance change memory, that is, a resistive memory device. By forming a bottom electrode from a doped semiconductor different material from a conventional one, it is possible to fabricate the memory device simultaneously with peripheral circuit elements. By having one or more electric field concentration regions in the bottom electrode, it is possible to reduce the power consumption reducing the voltage. The present invention can be also stacked vertically in any small and apply to the synaptic device array recently attracting the great interest as the next generation computing technology for realizing the neural imitation system.

6 Claims, 11 Drawing Sheets

RESISTIVE RANDOM ACCESS MEMORY DEVICE FOR 3D STACK AND MEMORY ARRAY USING THE SAME AND FABRICATION METHOD THEREOF

CROSS-REFERENCE TO RELATED APPLICATION

This application claims priority to Korean Patent Application No. 10-2017-0142238, filed on Oct. 30, 2017, under 35 U.S.C. 119, the entire contents of which are hereby incorporated by reference.

BACKGROUND

Field of the Invention

The present invention relates to a resistive switching memory, or resistive random access memory (RRAM) device, and more particularly to a resistive memory device for three-dimensional stacking, a memory array using the same and a fabrication method thereof.

Related Art

NAND flash memory technology is currently leading the mass storage market through continuously scaling down. However, in recent years, as the size of the device has been reduced to 20 nm or less, several reliability problems have arisen. Therefore, various kinds of next generation memories are being actively researched to replace NAND flash memory technology.

The RRAM having the simplest structure among them is advantageous for miniaturization and is generally formed of a metal-insulator-metal (MIM) material structure as shown in FIG. 1. The switching operation of the RRAM is divided into three phases. As shown in FIG. 2, a forming process for forming a conductive filament in an initial state to be a low resistance state, a reset operation for increasing the resistance of the conductive filament by breaking the conductive filament, and a set operation to be the low resistance state again. The forming process is the first operation of the set operation and requires a higher voltage.

In a conventional RRAM structure, the interface between the metal and the insulator is flat and so the electric field is evenly distributed when a voltage at both ends is applied. Therefore, in the MIM structure, the conductive filaments formed in the forming and set operations are formed at arbitrary positions, there is a limit to the exact control and a high reset current is shown. In particular, a unipolar RRAM operating as shown in FIG. 3A has a disadvantage for commercialization in that the dispersion of the switching parameters is uneven and the reset current is high. Therefore, recently, a bipolar RRAM operating as shown in FIG. 3B is more interested.

As shown in FIG. 4, a memory array using the RRAM has a structure vertically intersecting a top electrode and a bottom electrode to function as a word line and a bit line, respectively. To read data, 'V/2 method' is used. That is, as shown in FIG. 4, a voltage of V is applied to the bit line 200, which is the top electrode of the cell 300 to be read, and 0 V is applied to the word line 100 of the bottom electrode. The other cells 410, 420, 430, and 440 sharing the lines 100 and 200 are applied with only ½ V between the top and bottom electrodes. However, when the cell 300 selected for reading is in the high resistance state (HRS), the leakage current (the dashed line in FIG. 4) caused by the adjacent cells 430 and 440 is detected together with the current of the selected cell (the solid line in FIG. 4). The leakage current of these adjacent cells 430 and 440 has been the cause of errors in the read operation and limited the size of the array.

In order to solve the leakage current problem of adjacent cells, Korean Patent No. 10-1257365 discloses a technique for simultaneously forming a threshold switch layer and a resistance change layer. According to this, the bottom electrode is platinum (Pt), the top electrode is a transition metal such as tungsten (W), and the phase change layer between the electrodes is a niobium oxide ($Nb_2O_{6-x}$), a vanadium oxide ($V_2O_{6-x}$) or a transition metal oxide formed of Ti, Fe, Ni and the like. Applying a voltage to the electrodes to move the oxygen ions in the phase change layer inside the top electrode, a resistance change layer is formed in the top electrode by the oxidation reaction. And the threshold switch layer having the properties of the conductor is formed by growth from the bottom electrode changing the oxygen deficiency (oxygen vacancies) state by the thermal energy applied with the voltage. Thus, it shows that it is possible to form two films having different properties in a single forming process.

By the way, the Registration Patent No. 10-1257365 is a conventional MIM structure, the lower electrode is platinum, the top electrode is a transition metal such as tungsten, and between these electrodes the transition metal oxide is filled. Applying a voltage to the electrodes it is to move the oxygen ions to form the threshold switch layer and the resistance change layer. There is a limit to reduce the size of the device and it is difficult to implement a three-dimensional vertical stacked array. And there is a problem that should be prepared in a separate process because it is impossible to be fabricated with the array peripheral circuit elements and is not compatible with the silicon process.

SUMMARY

The present invention is to be fabricated simultaneously with peripheral circuit elements by compatibility with the conventional CMOS process as well as three-dimensional stacking by forming a bottom electrode from a semiconductor doped unlike the prior art. And it has a structure so that the electric field is concentrated on the bottom electrode to reduce the operating voltage for the power consumption.

To achieve the objectives, a resistive memory device according to the present invention comprises a bottom electrode formed by doping impurities into a semiconductor material; a resistance change layer formed on the bottom electrode; and a top electrode formed on the resistance change layer, wherein the bottom electrode has one or more electric field concentration regions toward the resistance change layer.

The resistance change layer may be formed of an insulating material including at least one of a silicon oxide film, a silicon nitride film, an aluminum oxide film, and a hafnium oxide film, and the top electrode may be formed of a metal containing tungsten (W).

The semiconductor material may be silicon, the bottom electrode may be a fin shape vertically and sequentially stacked with a silicon oxide layer, a doped silicon layer and a silicon oxide layer, the resistance change layer may surround the fin shape of the bottom electrode, the top electrode may surround the resistance change layer, and the electric field concentration regions may be the four corners of the doped silicon layer.

The semiconductor material may be silicon, the bottom electrode may be a doped silicon cylinder, the resistance change layer may surround the doped silicon cylinder, the top electrode may surround the resistance change layer, and the electric field concentration regions may be portions surrounded by the resistance change layer in the surface of the doped silicon cylinder constituting the lower electrode.

A resistive memory array according to the present invention comprises bit lines of a plurality of fin shapes formed by repeatedly and alternately stacking a silicon oxide layer and a doped silicon layer on a predetermined substrate, respectively and spaced apart from each other by a predetermined distance in a first direction; resistance change layers formed to surround the plurality of fin shapes; and word lines surrounding the resistance change layers and spaced apart from each other in a second direction perpendicular to the first direction.

The plurality of fin shapes may be formed by stacking a plurality of the doped silicon layers with the silicon oxide film interposed therebetween, both sides of each of the doped silicon layers contacting one of the resistance change layers, and a plurality of resistive memory devices may be vertically stacked in each of the word lines, the plurality of resistive memory devices each having electric field concentration regions in four corners of each side of the doped silicon layers contacting one of the resistance change layers.

The silicon oxide layer of each of the fin shapes may be removed at the portions surrounded by the resistance change layers under the word lines, the doped silicon layer of each of the fin shapes being a silicon columnar shape and contacting one of the resistance change layers at the removed portions of the silicon oxide layer, and a plurality of resistive memory devices may be vertically stacked in each of the word lines, the plurality of resistive memory devices each having electric field concentration regions in all around surface of the silicon columnar shape of the doped silicon layer contacting one of the resistance change layers.

A fabricating method of a resistive memory array according to the present invention comprises a first step of repeatedly and alternately stacking a silicon oxide layer and a silicon layer on a predetermined substrate to form a stacked structure having a plurality of silicon layers having the silicon oxide layer as an upper or lower layer; a second step of forming a plurality of bit lines by etching the stacked structure to have a plurality of fin shapes spaced a predetermined distance in a first direction; a third step of forming a resistance change layer on the plurality of fin shapes; and a fourth step of forming a plurality of word lines in a second direction perpendicular to the first direction by depositing a conductive material on the substrate including the resistance change layer and etching the conductive material and the resistance change layer.

Step 2-1 and Step 2-2 may further comprise between the second and the third steps, Step 2-1 being further depositing and etching a mask material on the substrate to form etching masks spaced apart in the second direction and surrounding the plurality of fin shapes, Step 2-2 being removing silicon oxide films exposed between the etching masks.

The mask material may be a silicon oxide layer.

An impurity doping step of the silicon layer may proceed at every time the silicon oxide film and the silicon layer are repeatedly stacked in the first step or after the plurality of fin shapes in the second step are formed.

The present invention, by forming a bottom electrode from a doped semiconductor, can be fabricated simultaneously with peripheral circuit elements due to the compatibility with the conventional CMOS process. By having one or more electric field concentration regions in the bottom electrode, it is possible to reduce the power consumption reducing the voltage. The present invention can be also stacked vertically in any small and apply to the synaptic device array recently attracting the great interest as the next generation computing technology for realizing the neural imitation system.

BRIEF DESCRIPTION OF THE DRAWINGS

FIG. 3A is a unipolar mode and FIG. 3B is a bipolar mode.

FIG. 19 is an I-V curve, FIG. 20 shows the endurance characteristics of the high resistance state (HRS) and the low resistance state (LRS) during 100 DC sweep cycles, and FIG. 21 shows the retention characteristics of HRS and LRS for 10,000 seconds at 100° C.

In these drawings, the following reference numbers are used throughout: reference number 10 indicates a silicon oxide film, 20 a silicon layer, 21 and 24 a bottom electrode, 30 and 50 a resistance change layer, 40 a top electrode, 101 and 102 an etching mask, 110, 120 and 130 a fin shape or a bit line, and 210, 212, 220 and 222 a word line.

DETAILED DESCRIPTION

Detailed descriptions of preferred embodiments of the present invention are provided below with accompanying drawings.

First, referring to FIG. 10 and FIG. 17, a resistive memory device of the present invention will be described.

Figure 10:
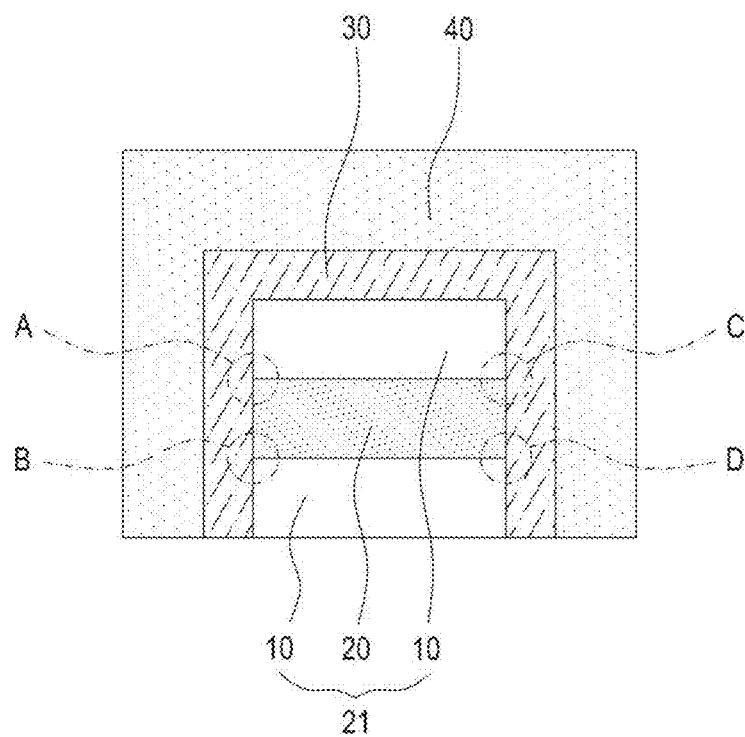
FIG. 10 is a cross-sectional view taken along the line AA' in FIG. 9.
Figure 17:
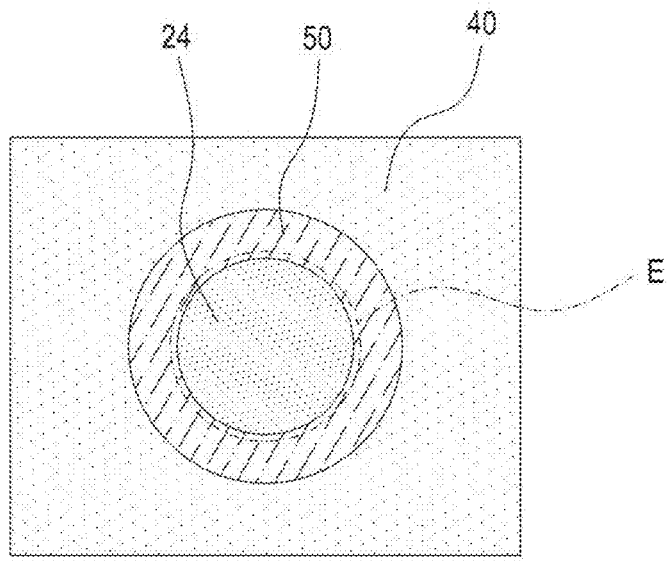
FIG. 17 is a cross-sectional view taken along the line BB' in FIG. 16.

A resistive memory device according to the present invention comprises, as commonly shown in FIGS. 10 and 17, a bottom electrode 21 or 24 formed by doping impurities into a semiconductor material; a resistance change layer 30 or 50 formed on the bottom electrode; and a top electrode 40 formed on the resistance change layer, wherein the bottom electrode 21 or 24 has one or more electric field concentration regions A, B, C and D, or E toward the resistance change layer 30 or 50.

Here, the semiconductor material forming the bottom electrode 21 or 24 may be any material as long as it can be made conductive by doping with impurities. However, materials such as a semiconductor material used in making circuit elements as well as the memory device, more specifically, silicon, silicon germanium, germanium and like are preferred for process compatibility and economics.

In addition, the bottom electrode can be formed not only with the substrate itself such as a silicon substrate but also with a conductive line doped at a high concentration into a polycrystalline or amorphous semiconductor material when stacked vertically. As a preferable example for the latter, the bottom electrode may be formed of n+ or p+ polysilicon doped with impurities (n+ or p+ doped polysilicon).

Since the resistance change layers 30 or 50 have a low resistance state LRS and a high resistance state HRS depending on the formation of a conducting path to perform a memory function of a cell, it may be formed of any material as long as a conductive path can be formed. However, it is preferably formed of an insulating material containing at least one of silicon oxide ($SiO_x$), silicon nitride ($SiN_x$), aluminum oxide ($AlO_x$) and hafnium oxide ($HfO_x$) for compatibility of the process.

In the present invention, the bottom electrode 21 or 24 may have at least one electric field concentration region A, B, C, D, or E toward the resistance change layer 30 or 50.

By having the above structural features, when a high set voltage is applied between the top electrode 40 and the bottom electrode 21 or 24, the electric field concentrates on the electric field concentration regions A, B, C, D and E of the bottom electrode. As a result, electrons thermally accelerated by a high electric field toward the top electrode 40 break covalent bonds of the material forming the resistance change layer 30 or 50 to cause dangling bonds. These dangling bonds are made of many traps in the direction of the top electrode 40 to form a conduction path, which facilitates the low resistance state LRS. When the reset voltage is applied to the negative voltage, the amount of the traps is reduced. And the conduction path is broken into a high resistance state HRS.

Therefore, by the electric field concentration regions A, B, C, D and E of the bottom electrode 21 or 24, a silicon oxide film ($SiO_2$) having ordinary dangling bonds at an interface can also be used to form the resistance change layer 30 or 50. Of cause, it is preferable that the resistance change layer 30 or 50 is formed of a high dielectric material having a dielectric constant higher than that of the silicon oxide film such as aluminum oxide ($AlO_x$) and hafnium oxide ($HfO_x$) because the high dielectric material can make electrons further collected in the electric field concentration regions A, B, C, D and E of the bottom electrode 21 or 24.

Furthermore, since the conduction path in the resistance change layer 30 or 50 is formed as a trap existing in the resistance change layer, it is possible to form the conduction path without a separate forming process. Thus, it is preferable to form the resistance change layer 30 or 50 with nitride.

Here, the nitride may be a material having a composition such as $SiN_x$, $AlN_x$, $ZrN_x$, $NiN_x$, $WN_x$, or $HfN_x$ in addition to $Si_3N_4$, but the silicon nitride film ($Si_3N_4$) is preferred for compatibility of the process.

The top electrode 40 may be formed of a metal such as W, Ni, Ti, or Ti which is widely used in a conventional CMOS process because of easy etching.

FIG. 10 is showing an embodiment of the present invention. The semiconductor material 20 may be silicon, more specifically, polysilicon. The bottom electrode 21 may be a fin shape vertically and sequentially stacked with a silicon oxide layer, a doped silicon layer and a silicon oxide layer such as a fin structure of a silicon oxide film ($SiO_2$) 10/an n+ or p+ doped silicon layer 20/a silicon oxide film ($SiO_2$) 10 in FIG. 10. The resistance change layer 30 may surround the fin shape of the bottom electrode 21. The top electrode 40 may surround the resistance change layer 30. And the electric field concentration regions may be the four corners A, B, C, and D of the doped silicon layer 20 constituting the bottom electrode 21.

Here, when the resistance change layer 30 is made of silicon nitride ($Si_3N_4$), the top electrode 40 is made of tungsten (W), and the bottom electrode 21 is grounded and the top electrode 40 is applied with 2 V, as shown in FIG. 18A, an electric field is concentrated at the four corners A, B, C and D of the silicon layer 20 constituting the bottom electrode 21, and the strength of the electric field is 5.15 MV/cm. This is much greater than 2.76 MV/cm in FIG. 18C showing a resistive memory device having a two-dimensional planar structure in the same condition.

FIG. 17 is showing another embodiment of the present invention. The semiconductor material 20 may be silicon, more specifically, polysilicon. The bottom electrode 24 may be a doped silicon cylinder (e.g., an n+ or p+ doped polysilicon cylinder). The resistance change layer 30 may surround the doped silicon cylinder 24. The top electrode may surround the resistance change layer 50. And the electric field concentration regions may be portions E surrounded by the resistance change layer 50 in the surface of the doped silicon cylinder 24 constituting the bottom electrode 24.

In this case, when the resistance change layer 30 is made of silicon nitride ($Si_3N_4$), the top electrode 40 is made of tungsten (W), and the bottom electrode 24 is grounded and the top electrode 40 is applied with 2 V, as shown in FIG. 18B, an electric field is concentrated on the surface E of the silicon cylinder constituting the lower electrode 24, and the strength of the electric field is 3.25 MV/cm. This is also much greater than 2.76 MV/cm in FIG. 18C showing a resistive memory device having a two-dimensional planar structure in the same condition.

As another embodiment of the present invention, the resistive memory device may have a two-dimensional planar structure as shown in FIG. 18C where the bottom electrode 21 is a doped polysilicon (i.e., an n+ or p+ doped polysilicon), the resistance change layer 30 is made of silicon nitride ($Si_3N_4$), and the top electrode 40 is made of a metal such as tungsten (W). In this case, the electric field of the bottom electrode is 2.76 MV/cm, which is smaller than in the previous two embodiments, but it has electrical characteristics of an excellent resistive memory as shown in FIGS. 19 to 21.

Figure 19:
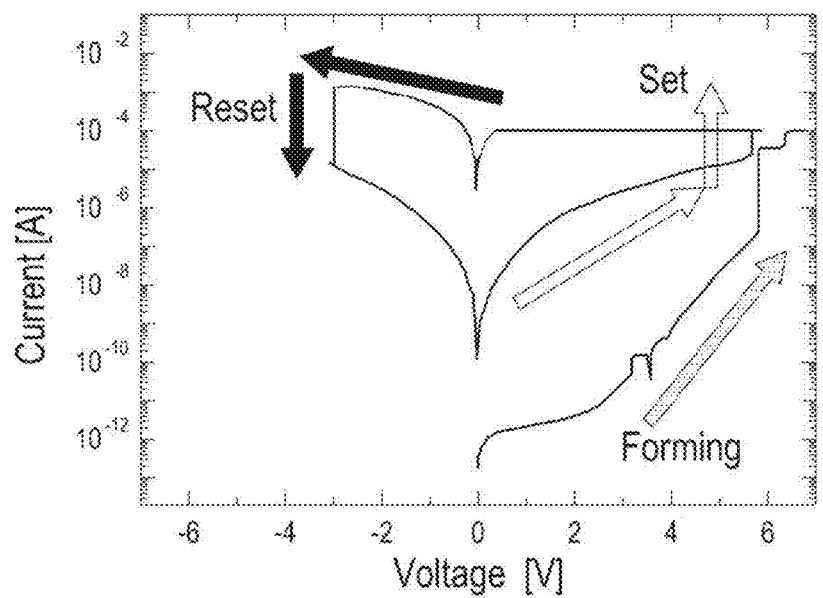
FIGS. 19 to 21 are diagrams showing electrical characteristics of a resistive memory in a two-dimensional planar resistive memory device composed of tungsten (W)/silicon nitride ($SiN_x$)/n+ doped polysilicon according to another embodiment of the present invention.
Figure 20:
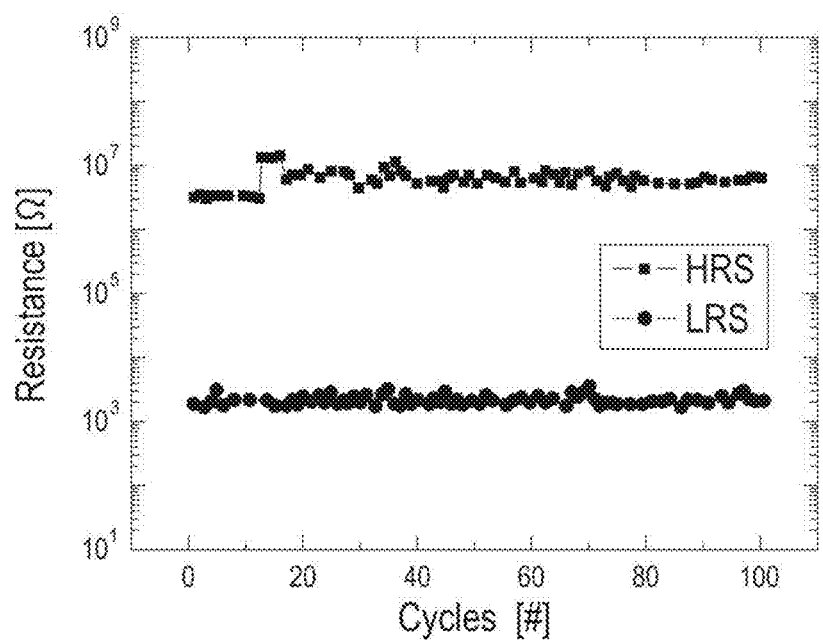
Figure 21:
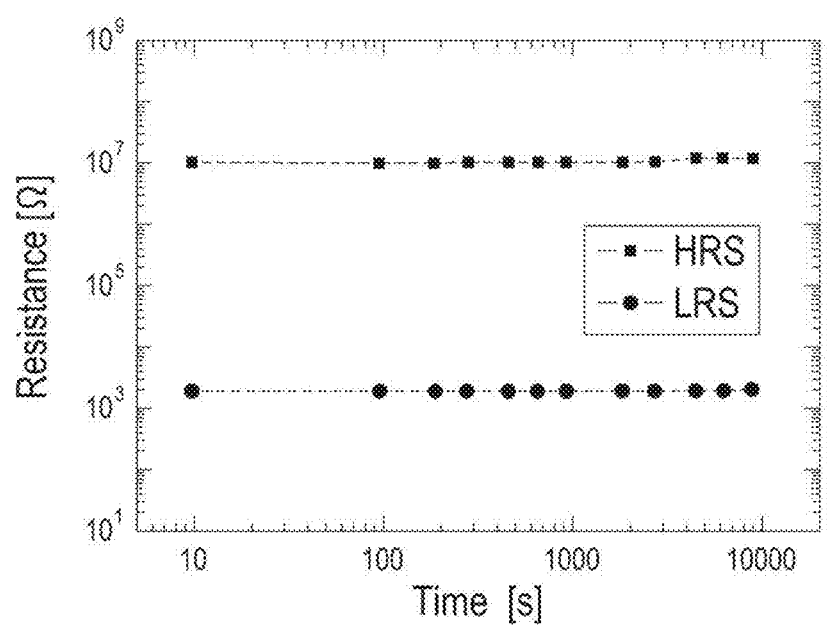

FIGS. 19 to 21 show electrical characteristics of a resistive memory device having a two-dimensional planar structure composed of tungsten (W)/silicon nitride film ($Si_3N_4$)/n+ doped polysilicon as a third embodiment mentioned above. FIG. 19 is an I-V curve. FIG. 20 is an endurance characteristic diagram of a high resistance state (HRS) and a low resistance state (LRS) during 100 DC sweep cycles, and FIG. 21 is a retention characteristic diagram of HRS and LRS for 10,000 seconds at 100° C.

Figure 9:
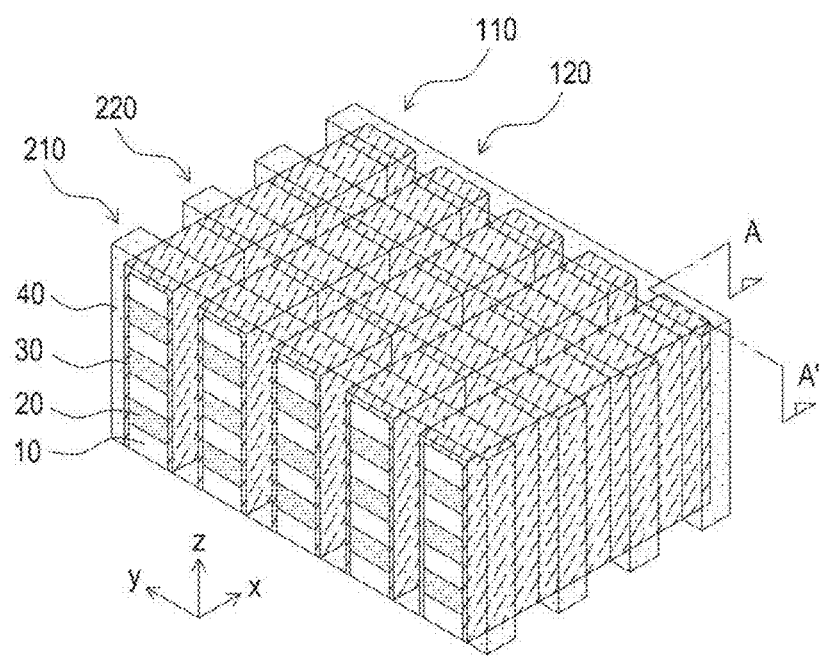
Figure 16:
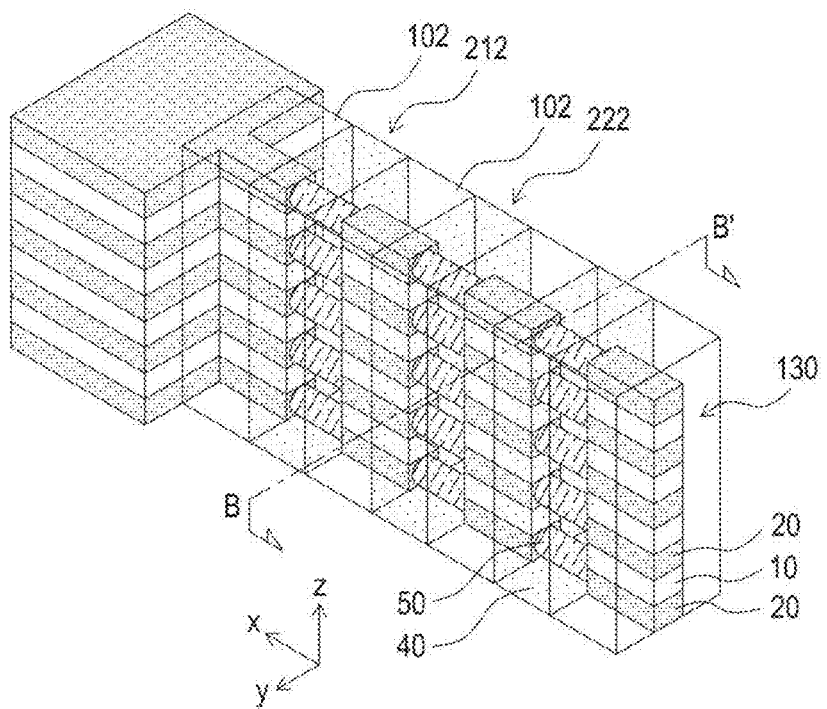

Next, referring to FIGS. 9 and 16, a resistive memory array of the present invention is described.

The resistive memory array of the present invention uses the above-described resistive memory device of the present invention as a unit cell element. As commonly exemplified in FIGS. 9 and 16, a resistive memory array according to the present invention comprises bit lines 110 and 120 of a plurality of fin shapes formed by repeatedly and alternately stacking a silicon oxide layer (SiO$_2$) 10 and a doped silicon layer (e.g., an n+ or p+ doped polysilicon) 20 on a predetermined substrate (not shown), respectively and spaced apart from each other by a predetermined distance in a first direction (e.g., y-axis direction); resistance change layers 30 or 50 formed to surround the plurality of fin shapes; and word lines 210 and 220 or 212 and 222 surrounding the resistance change layers and spaced apart from each other in a second direction (e.g., x-axis direction) perpendicular to the first direction.

By being configured as described above, it is possible to form bit lines as many as the number of the silicon layer (n+ or p+ doped polysilicon) 20 stacked with the silicon oxide film (SiO$_2$) 10 interposed therebetween because the fin shapes 110, 120, and 130 are the stacked bit lines respectively. Thus, high integration of the resistive memory can be easily achieved even in the conventional CMOS process. In addition, by using the above-described resistive memory device of the present invention as a unit cell element, the operation voltage and power consumption can be reduced.

Therefore, the resistive memory array of the present invention can be stacked vertically in any small for a low power driving, it can be applied to a synaptic device array for realizing the neural imitation system.

FIG. 9 is showing an embodiment of the resistive memory array of the present invention. The plurality of fin shapes 110 and 120 may be each formed by stacking a plurality of the doped silicon layers (e.g., n+ or p+ doped polysilicon layers) 20 with the silicon oxide film (SiO$_2$) 10 interposed therebetween. Both sides of each of the doped silicon layers 20 contact one of the resistance change layers 30. In each of the word lines 210 and 220, a plurality of resistive memory devices may be vertically stacked. And the plurality of resistive memory devices each may have electric field concentration regions in four corners A, B, C, and D of each side of the doped silicon layers contacting one of the resistance change layers.

FIG. 10 is a cross-sectional view taken along line AA' of FIG. 9 and showing the structure of a resistive memory device having electric field concentration regions at four corners A, B, C, and D of the doped silicon layer 20 described above.

FIG. 16 is showing another embodiment of the resistive memory array of the present invention. The silicon oxide layer (SiO$_2$) 10 of each of the fin shapes 130 is removed at the portions surrounded by the resistance change layers 50 under the word lines 212 and 222. The doped silicon layer (e.g., n+ or p+ doped polysilicon layer) 20 of each of the fin shapes 130 may be a silicon columnar shape and contact one of the resistance change layers 50 at the removed portions of the silicon oxide layer 10. In each of the word lines 212 and 222, a plurality of resistive memory devices may be vertically stacked. Each of the plurality of resistive memory devices may have electric field concentration regions in all around surface of the silicon columnar shape of the doped silicon layer 20 contacting one of the resistance change layers 50.

FIG. 17 is a cross-sectional view taken along line BB' of FIG. 16 and showing the structure of a resistive memory device having electric field concentration regions in all around surface E of the silicon columnar shape of the doped silicon layer 20 completely surrounded by the word line 40 and the resistance change layer 50.

Figure 18:
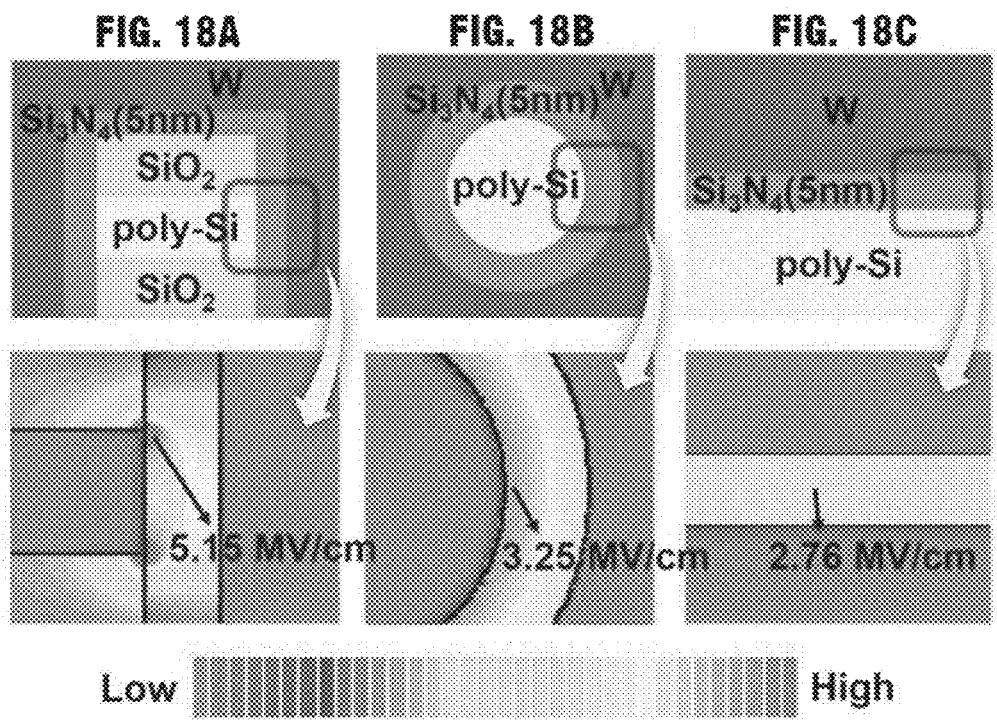
FIG. 18 is a simulation result obtained by comparing the concentration of electric field when the bottom electrode is grounded and 2V is applied to the top electrode similarly in the resistive memory devices having the structures of FIGS. 10 and 17 and the two-dimensional plane structure.

FIG. 18 is a simulation result obtained by comparing the concentration of electric field when the bottom electrode is grounded and 2V is applied to the top electrode similarly in the resistive memory devices having the structures of FIGS. 10 and 17 and the two-dimensional plane structure.

Next, a fabricating method of the resistive memory array of the present invention is described with reference to FIGS. 5 to 17.

Figure 5:
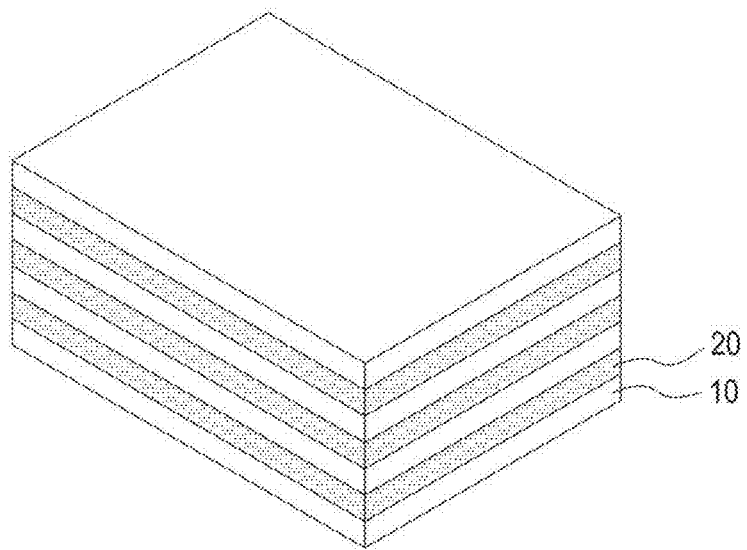
FIGS. 5 to 9 are process perspective views showing a fabricating process of a resistive memory array according to an embodiment of the present invention.
Figure 11:
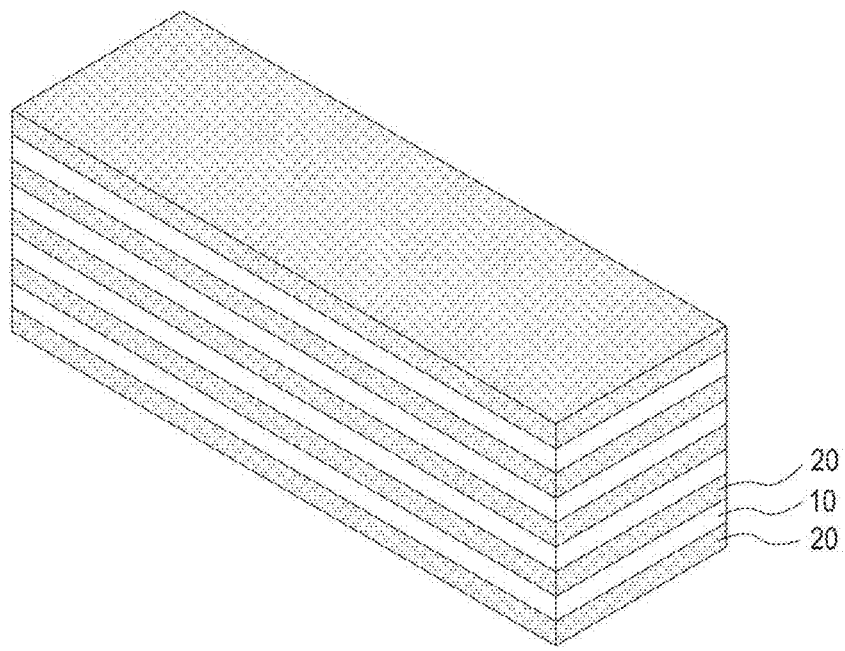
FIGS. 11 to 16 are process perspective views showing a fabricating process of a resistive memory array according to another embodiment of the present invention.

First, as shown in FIGS. 5 and 11, a silicon oxide film (SiO$_2$) 10 and a silicon layer (e.g., polysilicon layer) 20 are repeatedly and alternately stacked on a predetermined substrate (not shown) to form a stacked structure having a plurality of silicon layers having the silicon oxide layer as an upper or lower layer (Step 1).

The substrate may be any material capable of supporting and forming the stacked structure, but a silicon substrate is preferable in view of process compatibility and the like.

In the embodiment of FIG. 5, the silicon oxide film (SiO$_2$) 10 and the silicon layer 20 are stacked in this order, and in the embodiment of FIG. 11, they are stacked in the reverse order. The latter can also be implemented by the method of the former.

Figure 1:
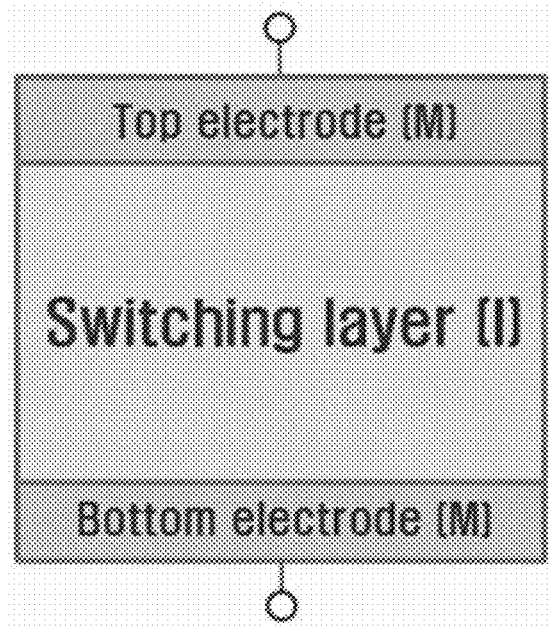
FIG. 1 is a cross-sectional view showing a basic structure of a conventional resistive memory device.
Figure 2:
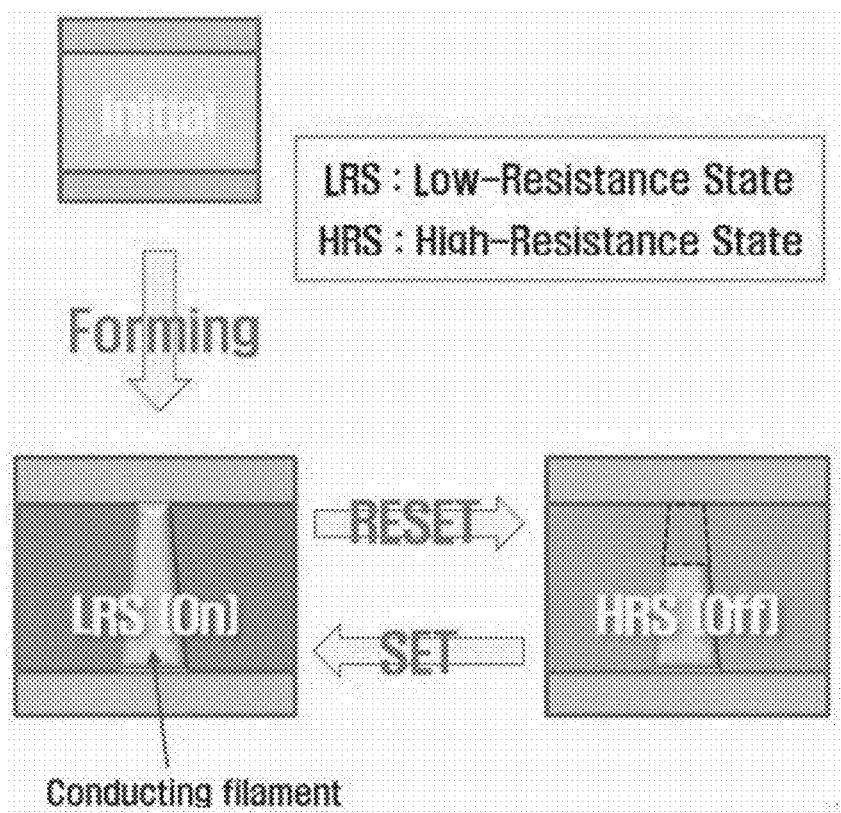
FIG. 2 is a conceptual diagram showing the switching operation characteristics of the resistive memory device having the structure of FIG. 1.
Figure 3:
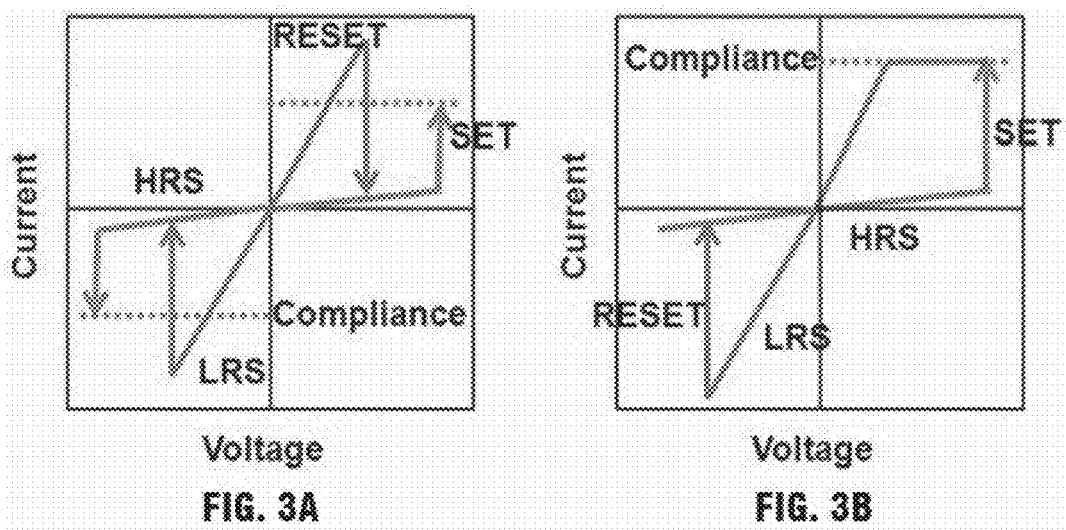
FIG. 3 is an electrical characteristic diagram showing the operation mode of the resistive memory device.
Figure 4:
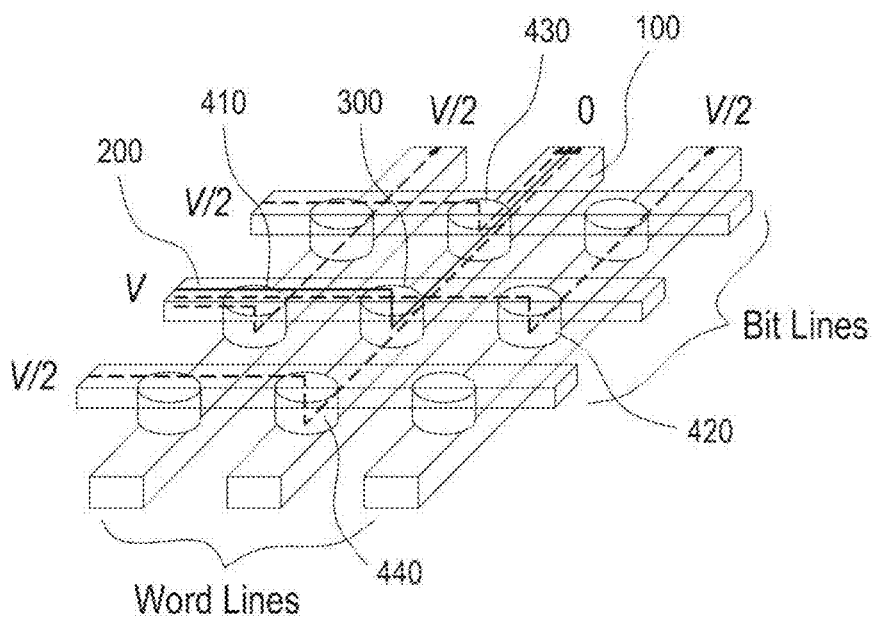
FIG. 4 is a schematic diagram illustrating the operation of a crossed array in which a leakage current of adjacent non-selected cells is also detected in a read operation by the 'V/2 method'.

However, in the case of FIG. 1I, there is an advantage that the silicon substrate can be used as the lowest silicon layer 20. In this case, the lowest silicon layer 20 is formed to have a conductivity type different from the silicon substrate.

The impurity doping process may be performed at every time the silicon oxide film and the silicon layer are repeatedly stacked. However, as described later, it can be performed after a plurality of fin shapes are formed.

Figure 6:
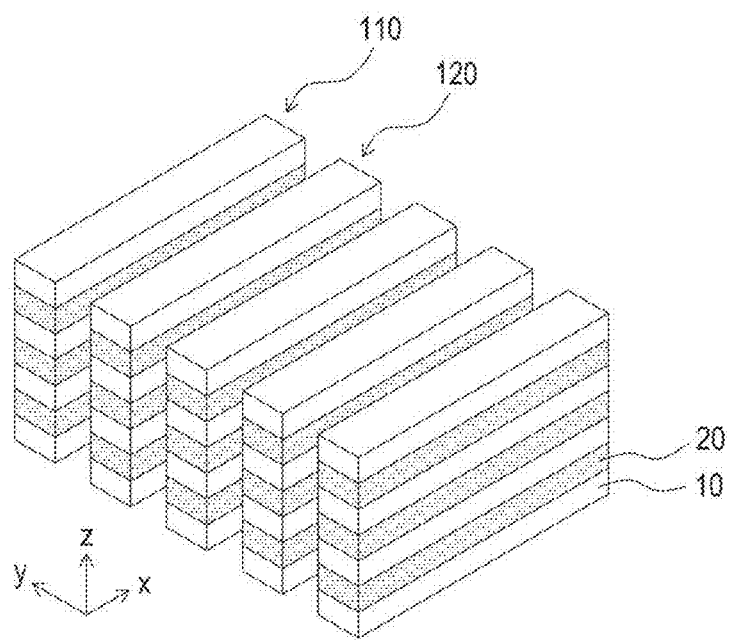
Figure 12:
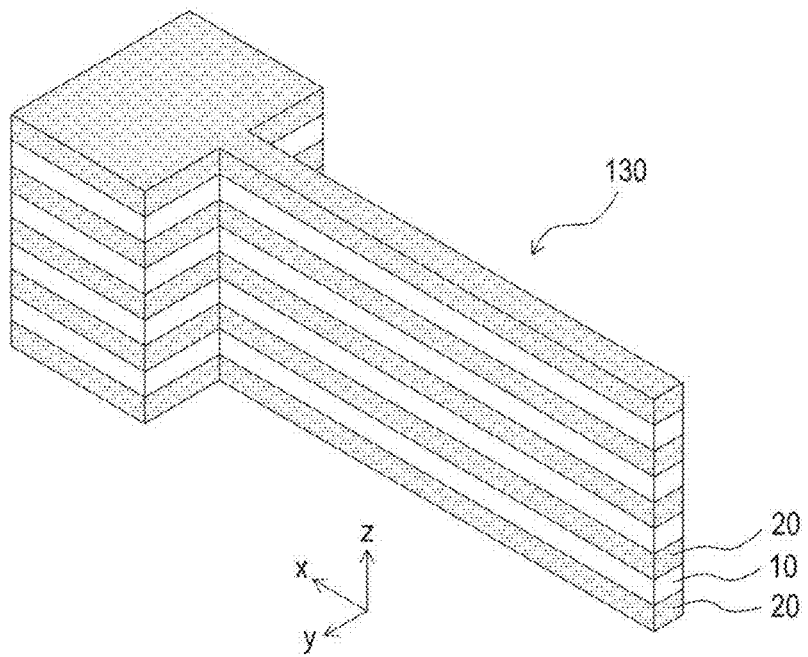
Figure 13:
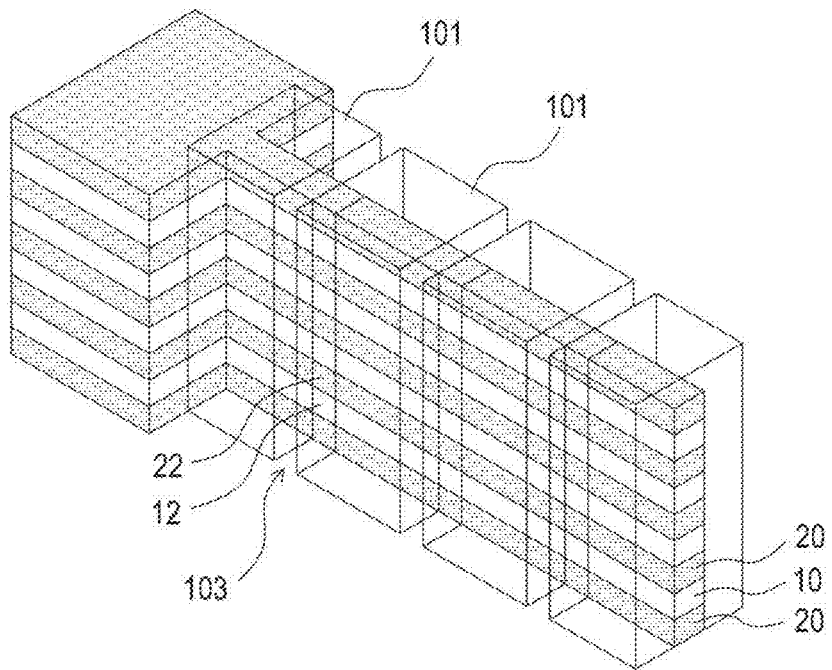

Next, as shown in FIGS. 6 and 12, the stacked structure is etched to have a plurality of fin shapes 110, 120, and 130 spaced a predetermined distance in a first direction (e.g., y axis direction) (Step 2).

If the impurity doping process is performed after forming the plurality of fin shapes 110, 120 and 130, it takes advantages of being able to complete the process by one time.

Figure 7:
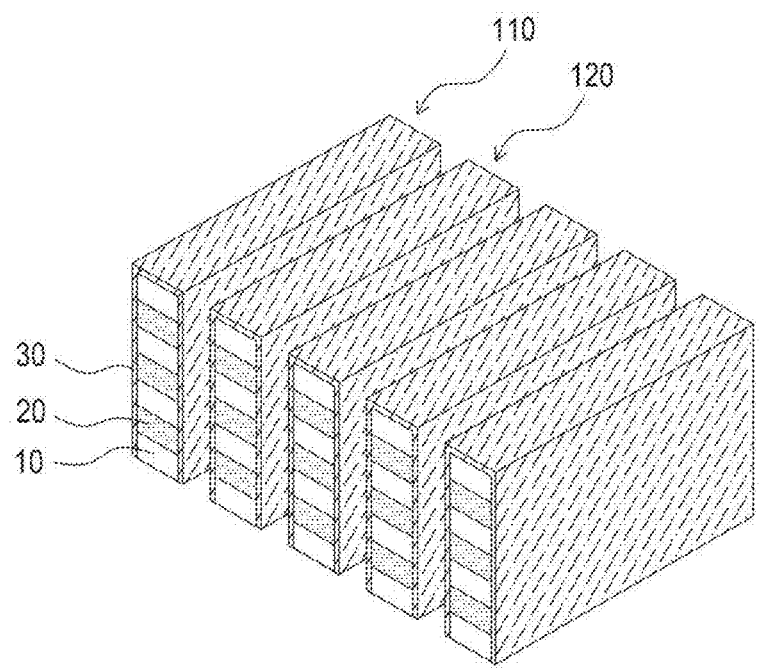

Then, as shown in FIG. 7, the resistance change layer 30 is formed on the plurality of fin shapes 110 and 120 (Step 3).

Here, the resistance change layer 30 may be formed of an insulating material containing at least one of the above-described silicon oxide (SiO$_x$), silicon nitride (SiN$_x$), aluminum oxide (AlO$_x$), and hafnium oxide (HfO$_x$).

Figure 8:
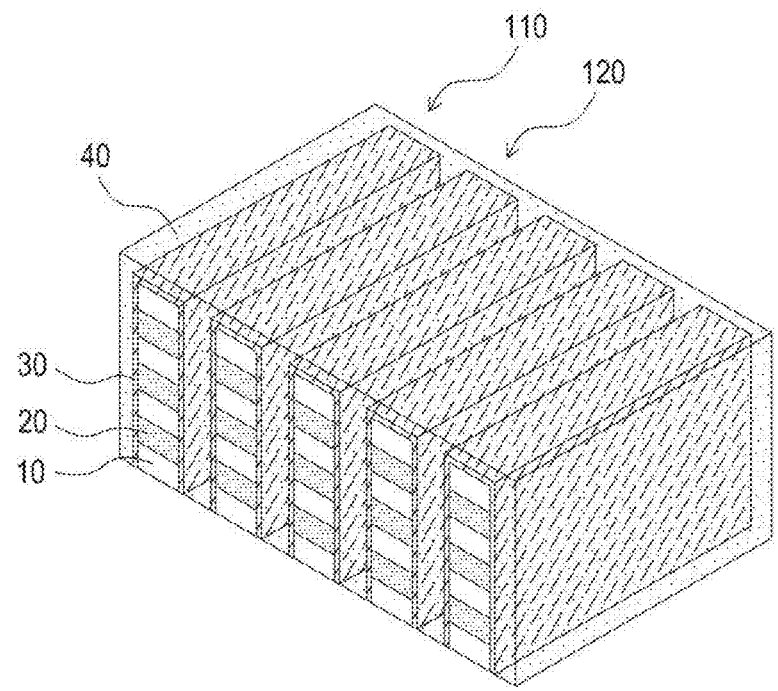

Thereafter, as shown in FIG. 8, a conductive material 40 is deposited on the substrate and the resistance change layer 30 and, as FIG. 9, the conductive material and the resistance change layer are etched to form a plurality of word lines 210 and 220 in a second direction (e.g., x axis direction) perpendicular to the first direction (Step 4)

Here, the conductive material 40 may be a metal such as W, Ni, Ti, or TiN as the top electrode material.

As another embodiment, Step 2-1 and Step 2-2 further may comprise between the second and the third steps. Here, Step 2-1 is further depositing and etching a mask material on the substrate to form etching masks spaced apart in the second direction and surrounding the plurality of fin shapes. And Step 2-2 is removing silicon oxide films exposed between the etching masks.

At this time, the mask material 101 is preferably formed of the same silicon oxide layer (SiO$_2$) as the silicon oxide layer 10 between the silicon layers 20. In this way, while removing the silicon oxide film 10 between the silicon layers 20 of the fin shape 130 with the etching masks 101 formed thicker in FIG. 13, the etching masks 101 become smaller as 102 in FIG. 14. Then, the silicon layer 20 exposed between the etching masks 102 can be etched from the corners to have a rounded surface so that a desired silicon cylinder shape 24 is formed.

Figure 14:
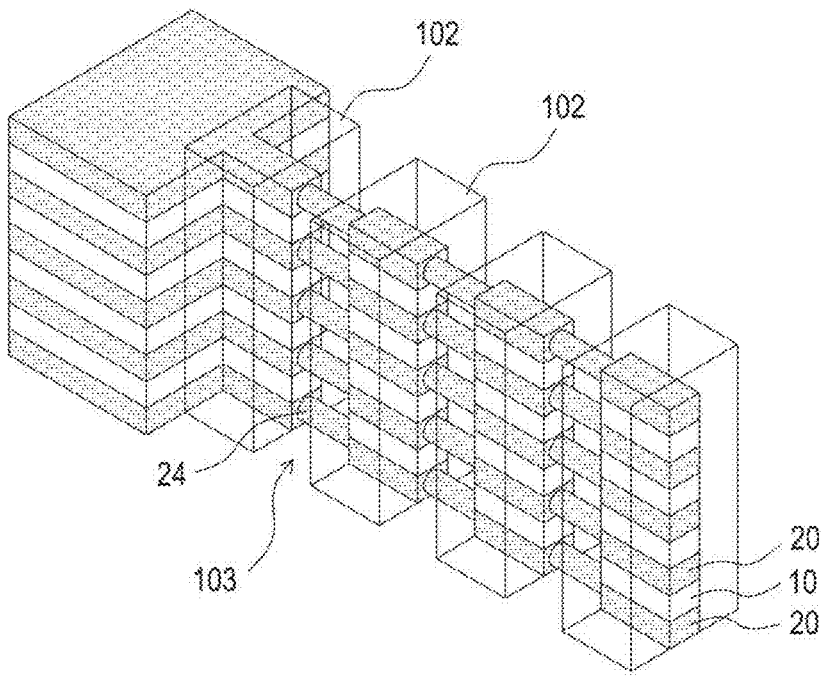
Figure 15:
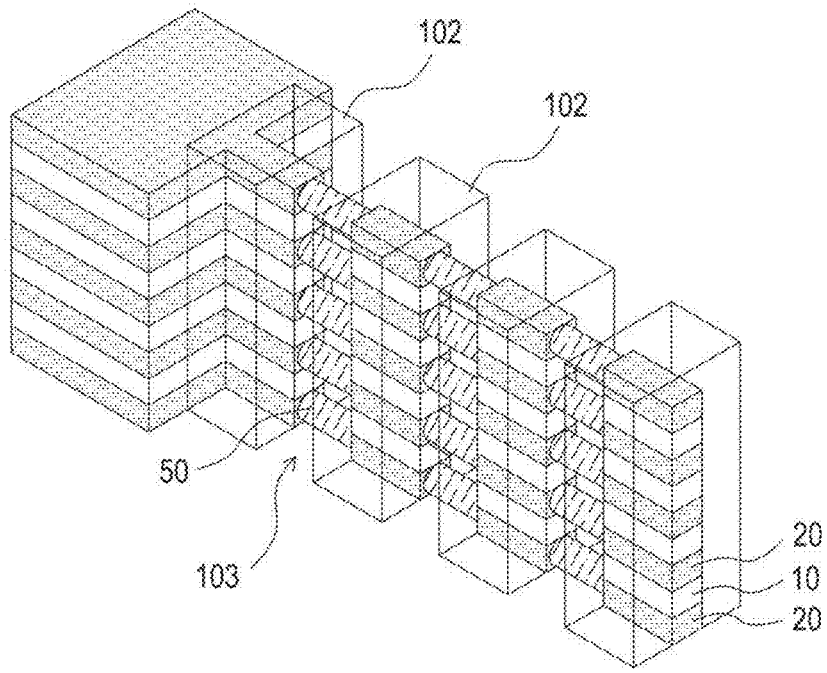

And then, as shown in FIGS. 14 and 15, the resistance change layer 50 is formed on the silicon cylinder shape 24 exposed and etched between the etching masks 102 by removing the silicon oxide film in the fin shape.

As shown in FIG. 16, the word lines 212 and 222 of the fourth step are formed by filling the space between the etching masks 102 with the conductive material 40 to surround the resistance change layer 50.

As described above, the method of fabricating a resistive memory array according to the present invention enables simultaneous manufacture of peripheral circuit elements with compatibility with the conventional CMOS processes as well as three-dimensional stacking.

What is claimed is:

1. A resistive memory device comprising:
a bottom electrode formed by doping impurities into a semiconductor material;
a resistance change layer formed on the bottom electrode; and
a top electrode formed on the resistance change layer,
wherein the bottom electrode has one or more electric field concentration regions toward the resistance change layer, wherein the semiconductor material is silicon, wherein the bottom electrode is a fin shape vertically and sequentially stacked with a silicon oxide layer, a doped silicon layer and a silicon oxide layer, wherein the resistance change layer surrounds the fin shape of the bottom electrode, wherein the top electrode surrounds the resistance change layer, and wherein the electric field concentration regions are the four corners of the doped silicon layer.

2. A resistive memory device comprising:
a bottom electrode formed by doping impurities into a semiconductor material;
a resistance change layer formed on the bottom electrode; and
a top electrode formed on the resistance change layer,
wherein the bottom electrode has one or more electric field concentration regions toward the resistance change layer, wherein the resistance change layer is formed of an insulating material including at least one of a silicon oxide film, a silicon nitride film, an aluminum oxide film, and a hafnium oxide film, and wherein the top electrode is formed of a metal containing tungsten (W), wherein the semiconductor material is silicon, wherein the bottom electrode is a fin shape vertically and sequentially stacked with a silicon oxide layer, a doped silicon layer and a silicon oxide layer, wherein the resistance change layer surrounds the fin shape of the bottom electrode, wherein the top electrode surrounds the resistance change layer, and wherein the electric field concentration regions are the four corners of the doped silicon layer.

3. A resistive memory device of claim 1, comprising:
a bottom electrode formed by doping impurities into a semiconductor material;
a resistance change layer formed on the bottom electrode; and
a top electrode formed on the resistance change layer,
wherein the bottom electrode has one or more electric field concentration regions toward the resistance change layer, wherein the semiconductor material is silicon, wherein the bottom electrode is a doped silicon cylinder, wherein the resistance change layer surrounds the doped silicon cylinder, wherein the top electrode surrounds the resistance change layer, and wherein the electric field concentration regions are portions surrounded by the resistance change layer in the surface of the doped silicon cylinder constituting the lower electrode.

4. A resistive memory device of claim 2, comprising:
a bottom electrode formed by doping impurities into a semiconductor material;
a resistance change layer formed on the bottom electrode; and
a top electrode formed on the resistance change layer,
wherein the bottom electrode has one or more electric field concentration regions toward the resistance change layer, wherein the resistance change layer is formed of an insulating material including at least one of a silicon oxide film, a silicon nitride film, an aluminum oxide film, and a hafnium oxide film, and wherein the top electrode is formed of a metal containing tungsten (W), wherein the semiconductor material is silicon, wherein the bottom electrode is a doped silicon cylinder, wherein the resistance change layer surrounds the doped silicon cylinder, wherein the top electrode surrounds the resistance change layer, and wherein the electric field concentration regions are portions surrounded by the resistance change layer in the surface of the doped silicon cylinder constituting the lower electrode.

5. A resistive memory array comprising:
bit lines of a plurality of fin shapes formed by repeatedly and alternately stacking a silicon oxide layer and a doped silicon layer on a predetermined substrate, respectively and spaced apart from each other by a predetermined distance in a first direction;
resistance change layers formed to surround the plurality of fin shapes; and
word lines surrounding the resistance change layers and spaced apart from each other in a second direction perpendicular to the first direction,
wherein the plurality of fin shapes are formed by stacking a plurality of the doped silicon layers with the silicon oxide film interposed therebetween, both sides of each of the doped silicon layers contacting one of the resistance change layers, and wherein a plurality of resistive memory devices are vertically stacked in each of the word lines, the plurality of resistive memory devices each having electric field concentration regions in four corners of each side of the doped silicon layers contacting one of the resistance change layers.

6. A resistive memory array comprising:
bit lines of a plurality of fin shapes formed by repeatedly and alternately stacking a silicon oxide layer and a doped silicon layer on a predetermined substrate, respectively and spaced apart from each other by a predetermined distance in a first direction;
resistance change layers formed to surround the plurality of fin shapes; and
word lines surrounding the resistance change layers and spaced apart from each other in a second direction perpendicular to the first direction,
wherein the silicon oxide layer of each of the fin shapes is removed at the portions surrounded by the resistance change layers under the word lines, the doped silicon layer of each of the fin shapes being a silicon columnar shape and contacting one of the resistance change layers at the removed portions of the silicon oxide layer, and wherein a plurality of resistive memory devices are vertically stacked in each of the word lines, the plurality of resistive memory devices each having electric field concentration regions in all around surface of the silicon columnar shape of the doped silicon layer contacting one of the resistance change layers.

* * * * *